(12) United States Patent
Heinz et al.

(10) Patent No.: US 6,190,941 B1
(45) Date of Patent: Feb. 20, 2001

(54) METHOD OF FABRICATING A CIRCUIT ARRANGEMENT WITH THERMAL VIAS

(75) Inventors: Helmut Heinz, Ansbach; Bernhard Schuch, Neusitz, both of (DE)

(73) Assignee: DaimlerChrysler AG, Stuttgart (DE)

( * ) Notice: Under 35 U.S.C. 154(b), the term of this patent shall be extended for 0 days.

(21) Appl. No.: 09/396,661

(22) Filed: Sep. 15, 1999

(30) Foreign Application Priority Data

Sep. 17, 1998 (DE) ............................................. 198 42 590

(51) Int. Cl.⁷ ........................... H01L 21/44; H01L 21/48; H01L 21/50
(52) U.S. Cl. ............................................................. 438/106
(58) Field of Search .............................................. 438/106

(56) References Cited

U.S. PATENT DOCUMENTS 5,200,366 * 4/1993 Yamada et al. .
6,063,646 * 5/2000 Okuno et al. .

FOREIGN PATENT DOCUMENTS

| 0055578 | 7/1982 | (EP) . |
| 0869704 | 10/1998 | (EP) . |
| 2304999 | 3/1997 | (GB) . |
| 3-152993 | 6/1991 | (JP) . |

\* cited by examiner

Primary Examiner—John F. Niebling
Assistant Examiner—Josetta Jones
(74) Attorney, Agent, or Firm—W. F. Fasse; W. G. Fasse

(57) ABSTRACT

An electronic component is mounted on a substrate such as a circuit board by means of a soldering process such as reflow soldering. The circuit board has a thermal via hole therethrough to provide a heat dissipation path from the top surface to the bottom surface of the circuit board, for dissipating heat from the electronic component. To prevent molten solder from penetrating through the via hole during the soldering process, the via hole is sealed prior to the soldering process. The via hole is sealed from the bottom surface of the substrate by carrying out a screen printing process including at least two printing passes to print a sealing material into the open hole of the thermal via.

19 Claims, 1 Drawing Sheet

METHOD OF FABRICATING A CIRCUIT ARRANGEMENT WITH THERMAL VIAS

PRIORITY CLAIM

This application is based on and claims the priority under 35 U.S.C. §119 of German Patent Application 198 42 590.2, filed on Sep. 17, 1998, the entire disclosure of which is incorporated herein by reference.

1. Field of the Invention

The invention relates to a method of fabricating a circuit arrangement, for example including a surface mount device mounted on a printed circuit board, having thermal through-hole contacts or vias provided through the circuit board.

2. Background Information

Many electronics applications utilize electronic circuit arrangements including electronic components that generate a rather high power dissipation and therefore heat dissipation during operation. This is especially true in circuit arrangements including power components such as power modules for controlling and driving other assemblies or the like. The various components of the circuit arrangement are typically mounted on a suitable support body or substrate. For example, in the field of motor vehicle electronics, it is typical to use surface mountable power electronic components, which are surface mounted with their respective rear contact surfaces in contact with a printed circuit board as the supporting substrate.

In order to adequately remove the heat generated by the power dissipation of the components, and especially the power components, one known solution relates to improving the vertical heat transfer through the supporting substrate. This is achieved by providing thermal through-contacts, i.e. so-called thermal vias, extending through the supporting substrate from the top surface to the bottom surface thereof. To form such thermal vias, it is typical to form one or more through-holes through the substrate directly beneath the rear contact or mounting surfaces of the respective components and particularly the power components, and then metallize the through-holes, for example with a copper coating, continuously through the entire thickness of the substrate and covering the entire inner surfaces of the through-holes.

A second known solution to the above mentioned heat dissipation problem relates to the external heat removal. In this regard, the substrate may be mounted on a metallic cooling body or heat sink such as a copper plate, which in turn conveys the power dissipation heat to a cooling system. Such a cooling body may be separated from the supporting substrate by an electrical insulating layer such as an insulating film or foil.

After applying the components on the top surface, i.e. the mounting surface, of the substrate, the components are electrically contacted with contact surfaces or particularly contact pads and/or circuit paths or traces of a metallic circuit path structure provided on the top surface of the substrate. In order to achieve this, a soldering paste is printed onto the various contact surfaces and the top surface of the thermal vias and is then melted in a reflow soldering process in order to solder-connect the component to the contact surfaces.

During the reflow soldering process, droplets or emitted sprays of solder or even melted portions of the metallic conductor path structure can permeate through the thermal vias to the bottom or back surface of the substrate, whereby such permeation of the molten metal material is especially actively driven due to the capillary action caused by the small diameter via holes. Once the molten metal material reaches the bottom surface of the supporting substrate, it damages or completely breaks through the electrical insulating layer such as an insulating film applied on the bottom surface of the supporting substrate. This results in electrical short circuits to the metallic cooling body or to a metal housing or the like that supports or encloses the substrate as well as the circuit arrangement.

SUMMARY OF THE INVENTION

In view of the above, it is an object of the invention to provide a process for fabricating a circuit arrangement which achieves advantageous characteristics with reference to the heat dissipation or removal, the reliability, the costs, and the simplicity of the fabrication process. More particularly, it is an object of the invention to provide a method for preventing the penetration of molten metal material during a reflow soldering process from the top surface to the bottom surface of a supporting substrate through via holes provided therein. The invention further aims to avoid or overcome the disadvantages of the prior art, and to achieve additional advantages, as apparent from the present specification.

The above objects have been achieved in a method for fabricating a circuit arrangement according to the invention, comprising providing a through-hole and particularly a thermal through-contact via in a supporting substrate, carrying out a screen printing process including at least two printing passes or stages so as to close the through-hole from the bottom surface of the supporting substrate by means of the applied screen printed material, and then mounting and soldering a component onto the top surface of the substrate.

More particularly, the invention provides that all of the thermal through-contacts or thermal vias in the substrate are closed or sealed by carrying out a screen printing process on the bottom or back surface of the substrate opposite the top mounting surface thereof, before the soldering process is carried out. The screen printing process involves arranging a screen printing film around the thermal vias, and then pressing the screen printing material into the openings of the thermal vias from the bottom surface of the substrate in a screen printing process including at least two printing stages or passes. Preferably, the screen printed materials used in the screen printing process are highly viscous, thixotropic, pasty and preferably solvent-free materials. The screen printed material may especially be selected corresponding to the material of the substrate. Herein, the term "highly viscous material" refers to a material having a viscosity that is so high that it is just still screen printable by any known screen printing process.

After the thermal via openings have been closed or sealed with the screen printed material, a suitable testing is carried out, for example by means of an optical examination against a back light or by means of an automated vacuum test in order to determine whether the opening of the respective via hole has been completely closed and sealed. Specimens that fail the testing are rejected or again subjected to the screen printing process. Acceptable specimens are passed to a process of drying the substrate and curing and hardening the screen printed material.

When the subsequent soldering process, for example a reflow soldering process, is carried out for mounting the components of the circuit arrangement on the top surface of the substrate, the printed closure or sealing of the via holes prevents the molten solder material from permeating through the via holes from the top surface to the bottom surface of the substrate, and thereby protects the bottom surface of the substrate from soiling or damage that would otherwise be caused by the molten solder. Nonetheless, the heat transport from the top surface to the bottom surface of the substrate through the thermal vias is not significantly diminished by the screen printed material that seals the thermal via holes. This is especially true if the screen printed material is confined to the opening of the via hole and does not overlap onto the rim of the metallization layer around the opening of the hole, or if any such overlap has a limited thickness.

By using a solvent-free screen printed material, a volume reduction or shrinking of the screen printed material during the curing and hardening thereof can be avoided, so that the formation of bubbles and/or cracks in the screen printed material is prevented. Otherwise, such bubbles or cracks would negatively influence the reliability of the closure or seal of the thermal via holes provided by the screen printed material. The respective diameter of the thermal via holes is matched or adapted to the respective utilized screen printing technique, and is particularly prescribed so that an adequate coverage and closure of the thermal vias within the opening volume of the respective via hole is achieved. For example, a predetermined minimum filling proportion of the total opening volume of a thermal via can be specified. The size of the via hole, the screen printed material, and the screen printing process are selected and adapted in combination, in such a manner that the screen printed material is preferably confined entirely within the opening cross-section of the via hole, i.e. that preferably none or only a small part of the rim of the thermally conducting metallization of the thermal via surrounding the via hole on the bottom surface of the substrate becomes covered by the screen printed material. This is preferred because the covering of the screen printed material onto the contact areas or rims around the thermal vias on the bottom surface of the substrate would have a negative influence on the thermal conduction and heat transfer at this thermal junction.

The screen printing process of applying the screen printed material into the thermal vias is repeated so often, and at least two times in succession, until the desired or required thickness of the screen printed material in the thermal vias is achieved, and until a complete surfacial covering or closing of the open cross-sections of the thermal via holes on the bottom surface of the substrate by the screen printed material is achieved.

The present invention provides a reliable and simple method for producing circuit arrangements, which can completely prevent the flow or penetration of solder material through the thermal vias provided in the substrate. The present method can be carried out with a low cost and completely independently of the particular embodiment of the thermal vias, for example independently of the type and configuration of the through-contacts provided in the thermal vias. The present method can be successfully and reliably carried out without diminishing the thermal transfer through the thermal vias even for relatively large diameters of the thermal vias, for example for via diameters in a range from 0.4 mm to 1 mm.

BRIEF DESCRIPTION OF THE DRAWINGS

In order that the invention may be clearly understood, it will now be described in connection with an example embodiment, with reference to the accompanying drawings, wherein.

DETAILED DESCRIPTION OF PREFERRED EXAMPLE EMBODIMENTS AND OF THE BEST MODE OF THE INVENTION

Figure 1:
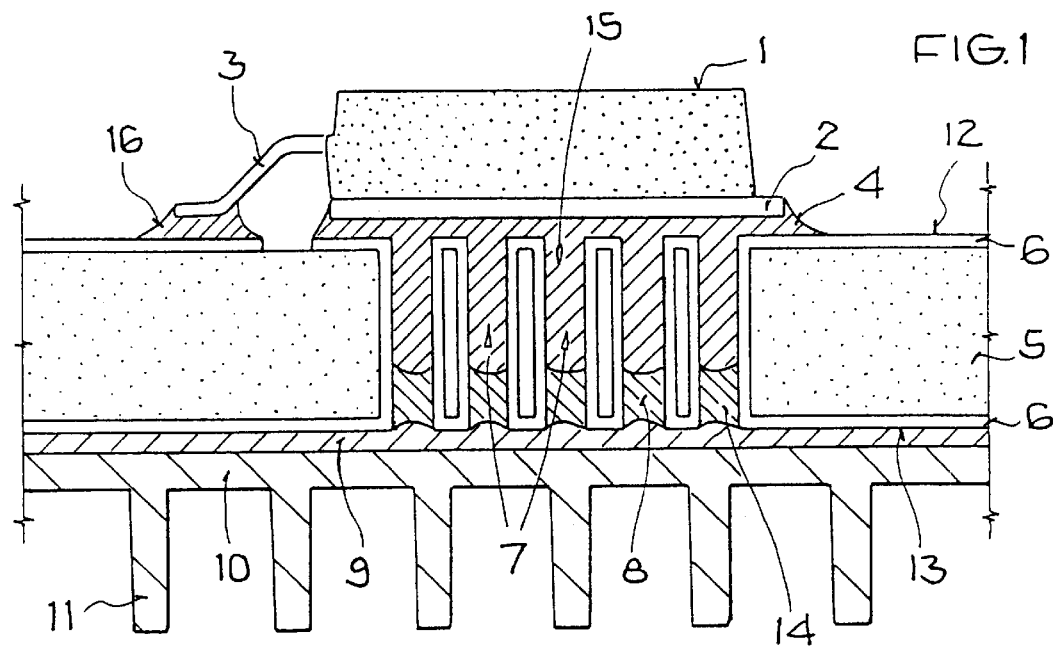
FIG. 1 is a sectional view of a portion of a circuit arrangement including a power component mounted on a substrate having thermal vias that are sealed according to the invention.
Figure 2:
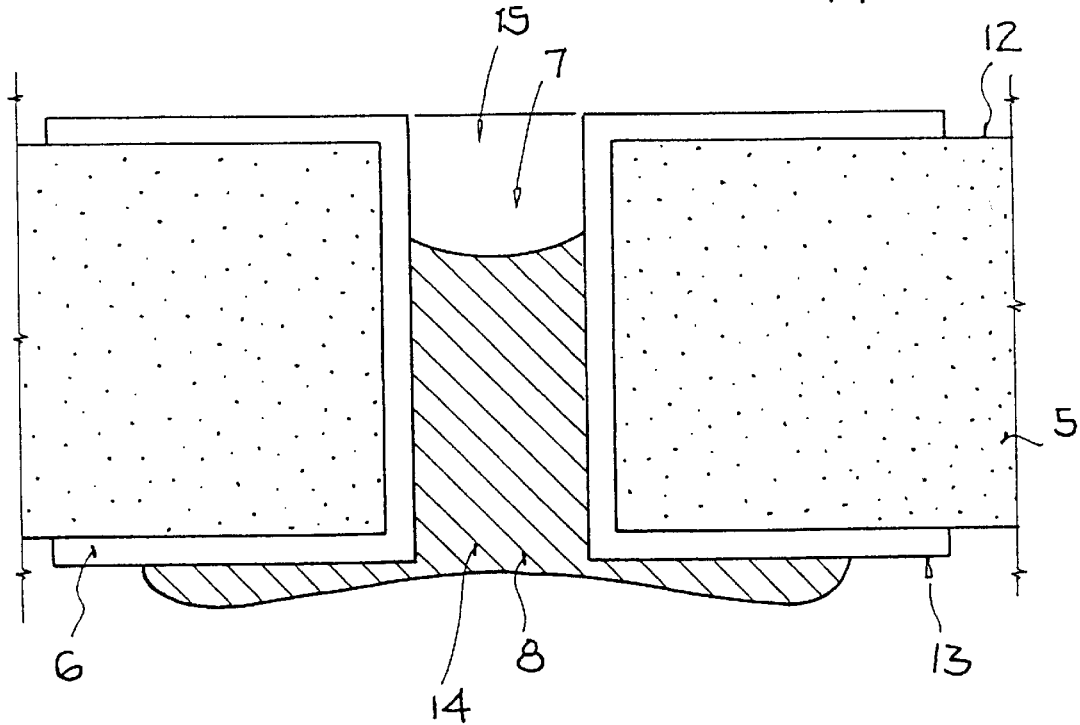
FIG. 2 is an enlarged detail sectional view of a sealed thermal via according to the invention.

FIG. 1 shows a circuit arrangement including at least one power electronics component 1 in addition to further active and passive components arranged on the top surface 12 of a supporting substrate particularly embodied as a circuit board such as a printed circuit board. The power component 1 has electrical contacts 3 that are to be contacted or electrically connected by means of contact pads 16 to the conductor path arrangement that has been provided on the top surface 12 of the circuit board 5 and that consists of copper coated with a gold-nickel (AuNi) alloy, for example.

During operation of the circuit arrangement, the several components thereof and particularly the power component 1 dissipates power in the form of heat which must be removed from the circuit arrangement to prevent damage and/or improper operation thereof. In order to remove the dissipated heat in a vertical direction, plural through-holes are bored through the circuit board 5 in the areas respectively below the power components 1, and the inner walls of these through-holes are continuously and entirely coated with a metallization layer 6 to form thermal through-contacts or thermal vias 7. After the metallization layer 6 has been deposited on the inner surface of each via through-hole, the remaining open cross-section or open hole 14, 15 of each thermal via has a diameter of approximately 0.5 mm, for example. Reference number 14 identifies the open hole of the thermal via 7 on the bottom surface 13 while reference number 15 identifies the open hole of the thermal via 7 on the top surface 12 of the circuit board 5.

The power component 1 is mounted so that a cooling vane or pad 2 thereof lies directly on the open holes 15 of the thermal vias 7 at the top surface 12 of the circuit board 5, so that an efficient heat transfer can be achieved from the top surface 12 to the bottom surface 13 of the circuit board 5. Specifically, the transfer will take place from the power component 1 through the cooling pad 2, through mounting solder 4 (which will be described in further detail below), and then through the metallization layers 6 of the thermal vias 7 to the bottom surface 13 of the circuit board 5. Then, from the bottom surface 13 of the circuit board 5, the dissipated heat is transferred further to a metallic cooling body or heat sink 10 embodied as a sheet metal heat sink including cooling fins 11 that dissipate the heat to a cooling air flow or that further transfer the heat to a cooling system. An electrically insulating and thermally conducting foil or film 9 is arranged between the bottom surface 13 of the circuit board 5 and the cooling body 10 to ensure electrical insulation of the circuit board from the cooling body.

The various components of the circuit arrangement are mounted and bonded onto the top surface 12 of the circuit board 5 by means of a reflow soldering process, to achieve the fabricated or assembled condition shown in FIG. 1. Any conventionally known reflow soldering process can be used in this regard, to apply and melt a solder material 4 between the pad 2 and the top surface 12 of the circuit board 5. To prevent the molten solder 4 from flowing through the open holes 14 and 15 of the thermal vias 7 from the top surface 12 to the bottom surface 13 of the circuit board 5 during the reflow soldering of the components onto the top mounting surface 12, the thermal vias 7 have previously been closed or sealed according to the invention.

The closing or sealing of the thermal vias 7 prior to the reflow soldering process is achieved by carrying out a screen printing process from the bottom surface 13 of the circuit board 5. In this context, a screen printing film having a diameter of e.g. 0.7 mm is applied around the bottom open hole 14 of a thermal via 7 having a diameter of e.g. 0.5 mm, on the bottom surface 13 of the circuit board 5. The screen printing material 8, which is for example a solid epoxy material, is printed into the bottom open hole 14 of the thermal via 7 located on the bottom surface 13 of the circuit board 5 in a two-step printing process such as a so-called double-printing or two-pass wet-on-wet printing process, in such a manner that the layer application of the screen printing material 8 onto the bottom surface 13 of the circuit board 5 is minimized. Particularly, this means that the radius of overlap of the screen printing material 8 onto the metallization layer 6 surrounding the open hole 14 of the thermal via 7, and the thickness of such an overlapping layer of the screen printing material 8 surrounding the area of the open hole 14 and protruding from the bottom surface 13 of the circuit board 5 is as small as possible, for example having a layer height or thickness of less than 60 $\mu$m. Moreover, the printing process is carried out to achieve a prescribed minimum filling height of the screen printing material 8 into the open hole of the thermal via 7 at the narrowest area or portion of the open via hole. For example, a filling height of at least 15% of the thickness of the circuit board 5 is to be achieved. It is further ensured that the screen printing material 8, after its final curing, does not comprise any defects such as inclusions, air bubbles, pores, and the like. In this manner an effective sealing of the thermal via 7 is surely achieved, without significantly diminishing the heat transfer path from the top surface 12 to the bottom surface 13 of the circuit board 5, through the metallization layer 6 of the thermal via 7.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of fabricating a circuit arrangement comprising the following steps:
    a) providing a supporting substrate having a first surface on a first side thereof and a second surface on a second side thereof and a through-hole passing through said substrate between said first and second surfaces;
    b) closing an opening of said through-hole in said second surface by screen printing a screen printing material into said opening from said second side of said substrate, wherein said screen printing includes at least two printing passes; and
    c) after said step b), soldering a component onto said first surface of said substrate.

2. The method according to claim 1, wherein said through-hole comprises a thermal via.

3. The method according to claim 2, wherein said step a) comprises boring a hole through said substrate and applying a metallization layer to cover an inner surface of said hole continuously from said first surface to said second surface so as to form said via.

4. The method according to claim 1, wherein said soldering in said step c) comprises carrying out a reflow soldering process.

5. The method according to claim 1, wherein said screen printing in said step b) comprises applying a screen printing film onto said a second surface over said opening, then carrying out said screen printing of said material into said opening, and then drying and curing said material in said opening.

6. The method according to claim 5, further comprising an additional step after said drying and curing of said material and before said step c), wherein said additional step comprises quality control testing the quality of closure of said opening provided by said material.

7. The method according to claim 6, wherein said quality control testing is optical testing involving checking whether a back light can be detected through said opening.

8. The method according to claim 6, wherein said quality control testing is vacuum testing involving applying a vacuum to said through-hole and checking for vacuum leakage.

9. The method according to claim 1, wherein said component is a power electronics component including a cooling vane base pad, and said step c) comprises soldering said base pad onto said first surface of said substrate directly over and covering said through-hole.

10. The method according to claim 3, wherein said applying of said metallization layer is carried out so that said metallization layer continuously extends from said inner surface of said hole onto said first surface and onto said second surface.

11. The method according to claim 10, wherein said screen printing is carried out so that said screen printing material is confined to said opening and does not overlap onto said metallization layer on said second surface.

12. The method according to claim 10, wherein said screen printing is carried out so that said screen printing material covers a cross-sectional area of said opening and additionally overlaps onto said metallization layer on said second surface for not more than 0.2 mm beyond a radius of said opening.

13. The method according to claim 10, wherein said screen printing is carried out so that said screen printing material covers a cross-sectional area of said opening and additionally overlaps onto said metallization layer on said second surface, and said screen printing material overlapped onto said metallization layer on said second surface has a thickness of no more than 60 $\mu$m.

14. The method according to claim 1, wherein said screen printing is carried out to fill with said screen printing material at least 15% of a depth of said through-hole measured between said first and second surfaces.

15. The method according to claim 1, wherein said screen printing material is a thixotropic screen printing material.

16. The method according to claim 1, wherein said screen printing material is a highly viscous solvent-free screen printing material.

17. The method according to claim 1, wherein said screen printing material is impervious to molten solder used in said step c).

18. The method according to claim 1, further comprising, after said step b) and before said step c), another step of arranging a thermally conducting and electrically insulating film on said second surface of said substrate, and then arranging a heat sink on said film.

19. The method according to claim 1, wherein said through-hole has a diameter in a range from 0.4 mm to 1 mm.

* * * * *

UNITED STATES PATENT AND TRADEMARK OFFICE
CERTIFICATE OF CORRECTION

| | | |
|---|---|---|
| PATENT NO. | : 6,190,941 B1 | Page 1 of 1 |
| APPLICATION NO. | : 09/396661 | |
| DATED | : February 20, 2001 | |
| INVENTOR(S) | : Heinz et al. | |

It is certified that error appears in the above-identified patent and that said Letters Patent is hereby corrected as shown below:

Title page,
Foreign Patent Documents
insert --3514093  10/1986  (DE)--;

Column 2,
Line 65, before "printed", insert --screen--;

Column 4,
Line 41, before "transfer", insert --heat--;

Column 5,
Line 30, after "pores,", insert --cracks--;

Column 6,
Line 3, before "second", delete --a--.

Signed and Sealed this

Fifth Day of February, 2008

JON W. DUDAS
*Director of the United States Patent and Trademark Office*